(12) United States Patent
Ouyang et al.

(10) Patent No.: US 11,869,440 B2
(45) Date of Patent: Jan. 9, 2024

(54) OLED DISPLAY MODULE AND TERMINAL DEVICE

(71) Applicant: Huawei Technologies Co., Ltd., Shenzhen (CN)

(72) Inventors: Shiangruei Ouyang, Shenzhen (CN); Chujung Shih, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/798,382

(22) PCT Filed: Nov. 6, 2020

(86) PCT No.: PCT/CN2020/127204
§ 371 (c)(1),
(2) Date: Aug. 9, 2022

(87) PCT Pub. No.: WO2021/159780
PCT Pub. Date: Aug. 19, 2021

(65) Prior Publication Data
US 2023/0076315 A1    Mar. 9, 2023

(30) Foreign Application Priority Data

Feb. 10, 2020   (CN) .......................... 202020158568.7

(51) Int. Cl.
*G09G 3/3266*    (2016.01)
*H10K 59/131*    (2023.01)
*H04M 1/02*    (2006.01)

(52) U.S. Cl.
CPC ........ *G09G 3/3266* (2013.01); *H04M 1/0266* (2013.01); *H10K 59/131* (2023.02); *G09G 2320/0233* (2013.01)

(58) Field of Classification Search
CPC .. G09G 3/3266; H10K 59/131; H04M 1/0266
See application file for complete search history.

(56) References Cited

U.S. PATENT DOCUMENTS

| | | |
|---|---|---|
| 2013/0113688 A1 | 5/2013 | Choi et al. |
| 2017/0004760 A1 | 1/2017 | Jang et al. |
| 2019/0237533 A1 | 8/2019 | Kim et al. |

(Continued)

FOREIGN PATENT DOCUMENTS

| | | |
|---|---|---|
| CN | 103107183 A | 5/2013 |
| CN | 107945726 A | 4/2018 |

(Continued)

*Primary Examiner* — Sardis F Azongha
(74) *Attorney, Agent, or Firm* — Conley Rose, P.C.

(57) ABSTRACT

An organic light-emitting diode (OLED) display system includes a first region located in a substrate. The first region is configured to accommodate a control element. A plurality of other regions located on both sides of the first region in the substrate are sequentially disposed based on distances from the first region. The plurality of other regions include a second region configured to accommodate a first circuit element, a third region configured to accommodate a first circuit clock signal line, a fourth region configured to accommodate a second circuit clock signal line, a fifth region configured to accommodate a second circuit element, a sixth region configured to accommodate a first low-potential port and a seventh region located on an upper surface of the substrate.

20 Claims, 9 Drawing Sheets

(56) References Cited

U.S. PATENT DOCUMENTS

2020/0274092 A1  8/2020  Yuan et al.
2023/0105934 A1  4/2023  Ma et al.

FOREIGN PATENT DOCUMENTS

| CN | 109188804 A | 1/2019 |
| CN | 109637447 A | 4/2019 |
| CN | 110098223 A | 8/2019 |
| EP | 3236464 A2 | 10/2017 |
| JP | 2009175476 A | 8/2009 |
| KR | 20090114767 A | 11/2009 |
| WO | 2017127563 A1 | 7/2017 |

Left    Right

Center    Edge

OLED DISPLAY MODULE AND TERMINAL DEVICE

CROSS-REFERENCE TO RELATED APPLICATIONS

This is a U.S. National Stage of International Patent Application No. PCT/CN2020/127204 filed on Nov. 6, 2020, which claims priority to Chinese Patent Application No. 202020158568.7 filed on Feb. 10, 2020. Both of the aforementioned applications are hereby incorporated by reference in their entireties.

TECHNICAL FIELD

This application relates to the electronic field, and in particular, to an OLED display module and a terminal device.

BACKGROUND

An organic light-emitting diode (organic light-emitting diode, OLED) is a current-type organic light-emitting device. The OLED features lightness, high brightness, low power consumption, a high response speed, high definition, high flexibility, high luminous efficiency, and the like, and therefore the OLED may meet more requirements of people for a display technology. Currently, most display vendors focus on the OLED for research, and therefore the OLED is used as a display apparatus for most terminal devices.

However, there is a specific circuit arrangement around a display region of an OLED screen, and therefore a frame of the OLED screen is always limited by this, and the frame cannot be further reduced.

SUMMARY

Embodiments of this application provide an OLED display module and a terminal device. Positions of a control emission circuit (emission circuit, EM) element and an EM clock signal line (clock, Clk) are interchanged, so that a low potential VSS can cover the EM element, to reduce impedance of an emission layer VSS (emission layer vss, ELVES) or to reduce a frame of the OLED display module -while original impedance is maintained.

According to a first aspect, an OLED display module is provided. The display module includes: a first region located in a substrate, where the first region is used to arrange a control element; a plurality of other regions located on both sides of the first region in the substrate, where the plurality of other regions are sequentially disposed in ascending order of distances from the first region, and the plurality of other regions sequentially include: a second region, used to arrange a first circuit element; a third region, used to arrange a first circuit clock signal line; a fourth region, used to arrange a second circuit clock signal line; a fifth region, used to arrange a second circuit element; and a sixth region, used to arrange a first low-potential port; a seventh region located on an upper surface of the substrate, where the seventh region covers the sixth region and partially covers the fifth region, and is used to arrange a second low-potential port, and the first low-potential port is electrically connected to the second low-potential port; and an eighth region located on the upper surface of the substrate, where the eighth region covers the seventh region and the upper surface of the substrate, and is used to arrange a third low-potential port.

In a possible implementation, that the seventh region partially covers the fifth region includes: covering a part of the fifth region, or completely covering the fifth region.

in a possible implementation, a partial coverage distance is from 50 microns to 100 microns.

In a possible implementation, the first circuit element is a gate on array, and the second circuit element is a control emission circuit; or the first circuit element is a control emission circuit, and the second circuit element is a gate on array.

In a possible implementation, a spacing between the first circuit clock signal line and the second circuit clock signal line is from 5 microns to 15 microns.

According to a second aspect, a terminal device is provided. The terminal device includes the OLED display module in the first aspect.

This application discloses the OLED display module and the terminal device. Positions of an EM element and an EM Clk are interchanged, so that a VSS may extend to a position above the EM element and cover the EM element; and if original impedance is maintained for the VSS, a frame of the OLED display module may be reduced; or if an original size is maintained for the VSS, impedance of an ELVSS may be reduced.

DESCRIPTION OF EMBODIMENTS

The following describes technical solutions in embodiments of this application with reference to the accompanying drawings in embodiments of this application.

In the description of this application, directions or position relationships indicated by the terms "center", "up", "down", "front", "rear", "left", "right", "vertical", "horizontal", "top", "bottom", "inside", "outside", and the like are directions or position relationships shown based on the accompanying drawings, and are merely intended to facilitate description of this application and simplify the descriptions, but are not intended to indicate or imply that an apparatus or an element needs to have a specific direction or be formed and operated in a specific direction, and therefore shall not be understood as a limitation on this application.

In the description of this application, it should be noted that unless otherwise specified and limited explicitly, the terms "mounting", "connected", and "connection" shall be understood in a broad sense. For example, there may be a fixed connection, a detachable connection, an abutting connection, or an integrated connection. A person of ordinary skill in the art may understand specific meanings of the terms in this application based on a specific situation.

The embodiments of this application provide an OLED display module and a terminal device. The terminal device may be a mobile phone, a tablet computer, a notebook computer, an ultra-mobile personal computer (ultra-mobile personal computer, UMPC), a handheld computer, a netbook, a personal digital assistant (personal assistant digital, PDA), a wearable device, a virtual reality device, or the like. This is not limited in the embodiments of this application.

The following describes technical solutions in embodiments of this application with reference to the accompanying drawings in embodiments of this application.

Figure 1:
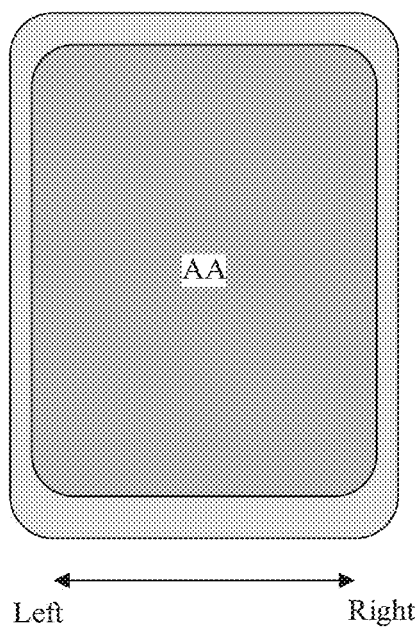
FIG. 1 is a schematic diagram of a top view of an OLED display module according to an embodiment of this application.

FIG. 1 is a schematic diagram of a top view of an OLED display module according to an embodiment of this application.

In FIG. 1, it may be learned from the top view that the OLED display module includes a central active area (active area, AA) in dark gray and an OLED substrate (substrate) in light gray. The AA is disposed in the substrate.

Figure 2:
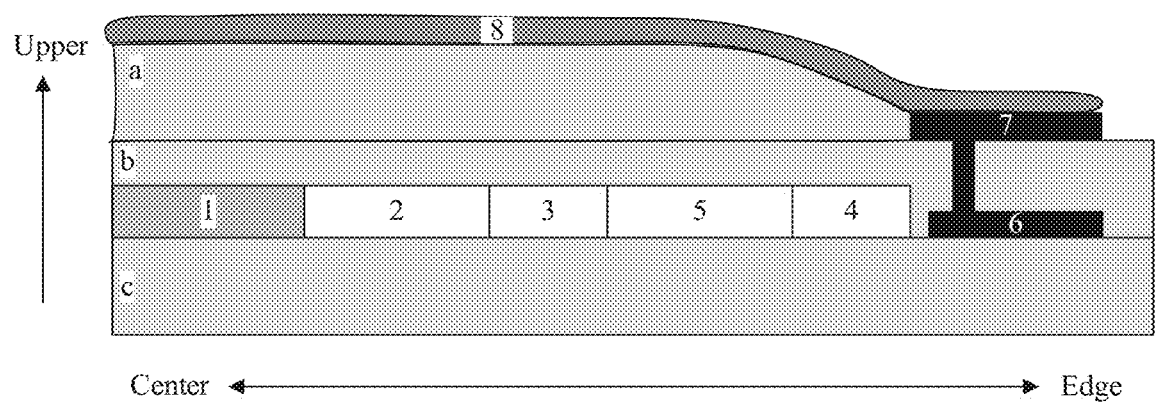
FIG. 2 is a schematic diagram of a front cross-section of an OLED display module according to an embodiment of this application.

FIG. 2 is a schematic diagram of a front cross-section of an OLED display module according to an embodiment of this application. It may be more clearly learned from FIG. 2 that the cross-section is located on a left edge or a right edge of the OLED module, and the AA is located in the substrate. In an example, the substrate may include three parts, for example, a part a, a part b, and a part c in FIG. 2. The part a of the substrate and the part c of the substrate may be made of an organic compound, and the part b of the substrate may be made of an inorganic compound. It should be noted that the part shown in FIG. 2 may be a left edge or a right edge of the OLED display module in FIG. 1. It may be understood that the OLED display module shown in FIG. 1 is of a vertically and horizontally symmetrical structure.

In FIG. 2, a region 1 may be disposed in the part b of the substrate, and may be used to arrange the AA in FIG. 1. In an example, a region 2 may be disposed in the part b of the substrate, and a gate on array (gate on array, GOA) element (device) may be arranged in the region 2.

Figure 3:
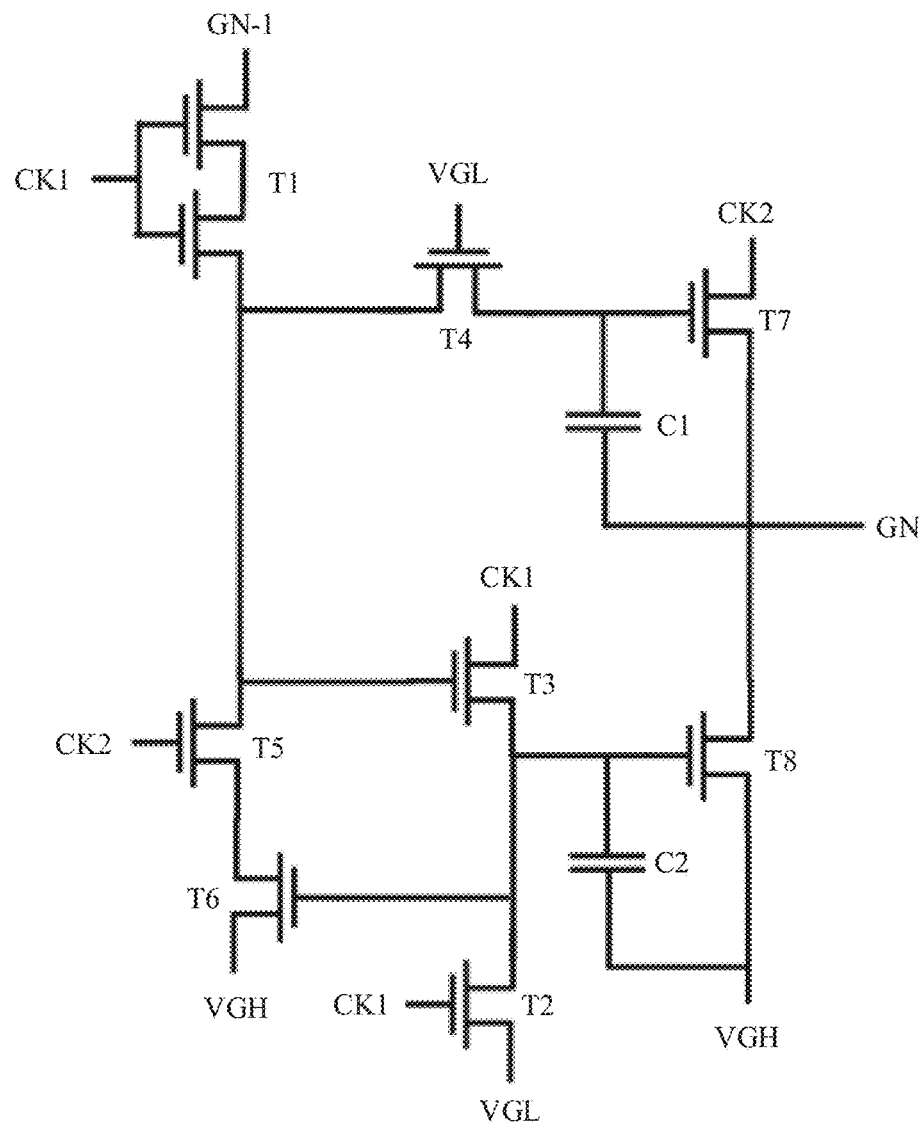
FIG. 3 is a schematic diagram of a GOA circuit according to an embodiment of this application.

In an example, the GOA device may be shown in FIG. 3. FIG. 3 is a schematic diagram of a GOA circuit according to an embodiment of this application. It should be noted by a person in the art that FIG. 3 shows only a part of the GOA circuit. Specifically, the GOA circuit may include N circuits shown in FIG. 3, where N is greater than or equal to 1, and is a positive integer. In addition, it should be noted by a person in the art that the GOA circuit may also be referred to as a gate on panel (gate on panel, GOP).

As shown in FIG. 3, the GOA circuit includes a switching group T1, a switching transistor T2, a switching transistor T3, a switching transistor T4, a switching transistor T5, a switching transistor T6, a switching transistor T7, a switching transistor T8, a capacitor C1, and a capacitor C2. In an example, the switching group T1 may include two MOS transistors, and each of the switching transistor T2, the switching transistor T3, the switching transistor T4, the switching transistor T5, the switching transistor T6, the switching transistor T7, and the switching transistor T8 may also include a metal oxide semiconductor (metal oxide semiconductor, MOS) transistor. In an example, the MOS transistor may be an NMOS transistor or a PMOS transistor. It may be learned from FIG. 3 that the GOA circuit may control a connection state of the switching group and different switching transistors based on input signals such as a clock signal 1 (clock1, CK1) and a clock signal 2 (clock 2, CK2).

Figure 4:
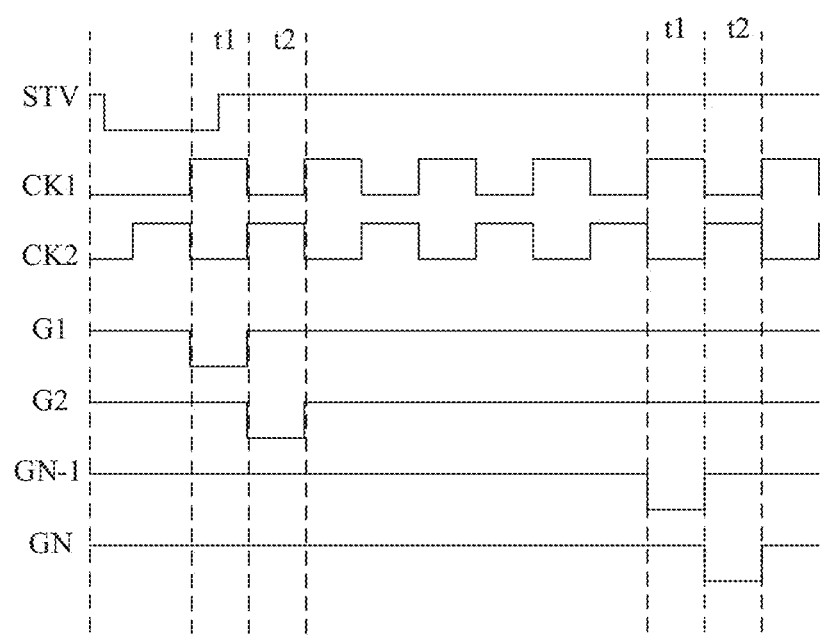
FIG. 4 is a schematic diagram of a waveform of the circuit shown in FIG. 3.

For example. FIG. 4 is a schematic diagram of a waveform of the circuit shown in FIG. 3. It may be learned that FIG. 4 includes three input signals: a start pulse (start pulse, STV), the CK1, and the CK2. In an example, it may be understood that the GOA circuit may include one or more circuits shown in FIG. 3, and the plurality of circuits shown in FIG. 3 are connected to each other. When N is 1, the STV is input at GN-1 as an initial start pulse, and is used to provide most original input information for the GOA circuit, so that a GN signal is finally output after passing through the plurality of circuits shown in FIG. 3. It may be learned that the STY is provided as the initial start pulse for the GOA circuit. Therefore, in a time period in which the CK1 is at a high level and the CK2 is at a low level, in other words, at a moment t1, G1 is also at a low level. Then, in a time period in which the CK1 is at a low level and the CK2 is at a high level, in other words, at a moment t2, G2 is at a low level. That is, it may be considered that after one signal change of the CK1 and the CK2, information of G1 is shifted to G2, and after a plurality of signal periods, namely, t1+t2, the information of G1 is shifted to GN.

Figure 5A:
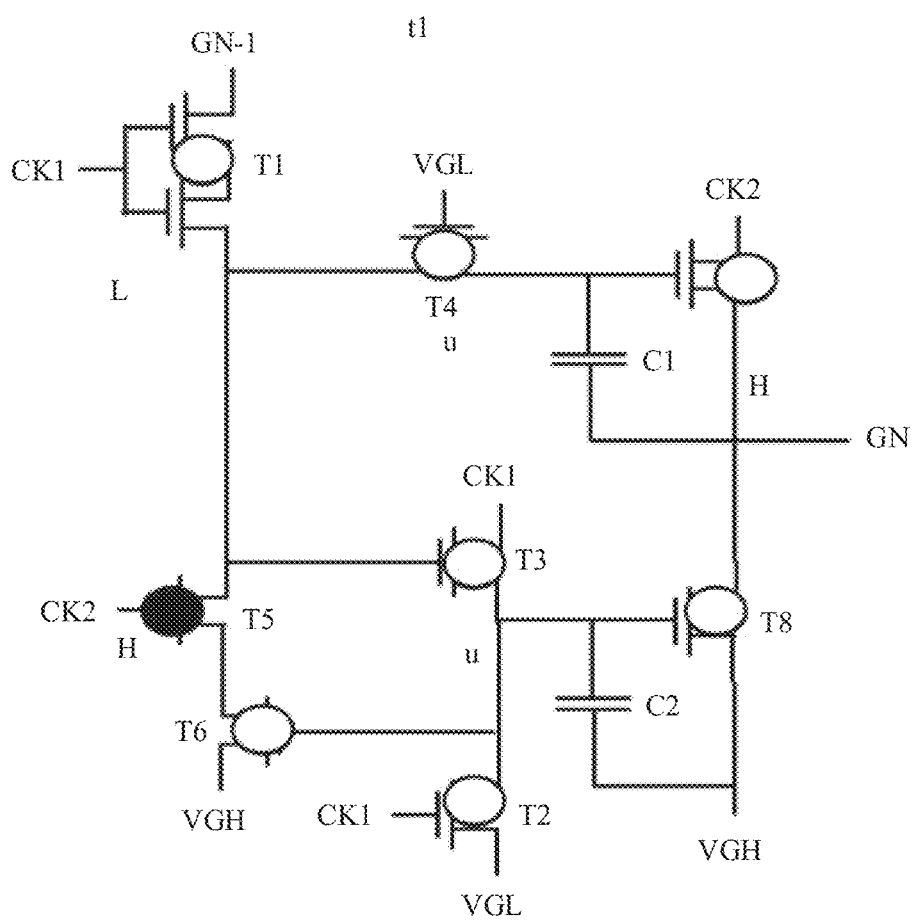
FIG. 5a is a schematic diagram of a circuit connection of the circuit shown in FIG. 3.

FIG. 5a is a schematic diagram of a circuit connection of the circuit in FIG. 3. In an example, FIG. 5a is a schematic diagram of a circuit connection of the circuit in FIG. 3 at the moment t1. It may be learned that in FIG. 5a, a white circle indicates that a circuit in which a switching group or a switching transistor is located is in a connected state, and a black circle indicates that a circuit in which a switching transistor is located is in a disconnected state.

Figure 5B:
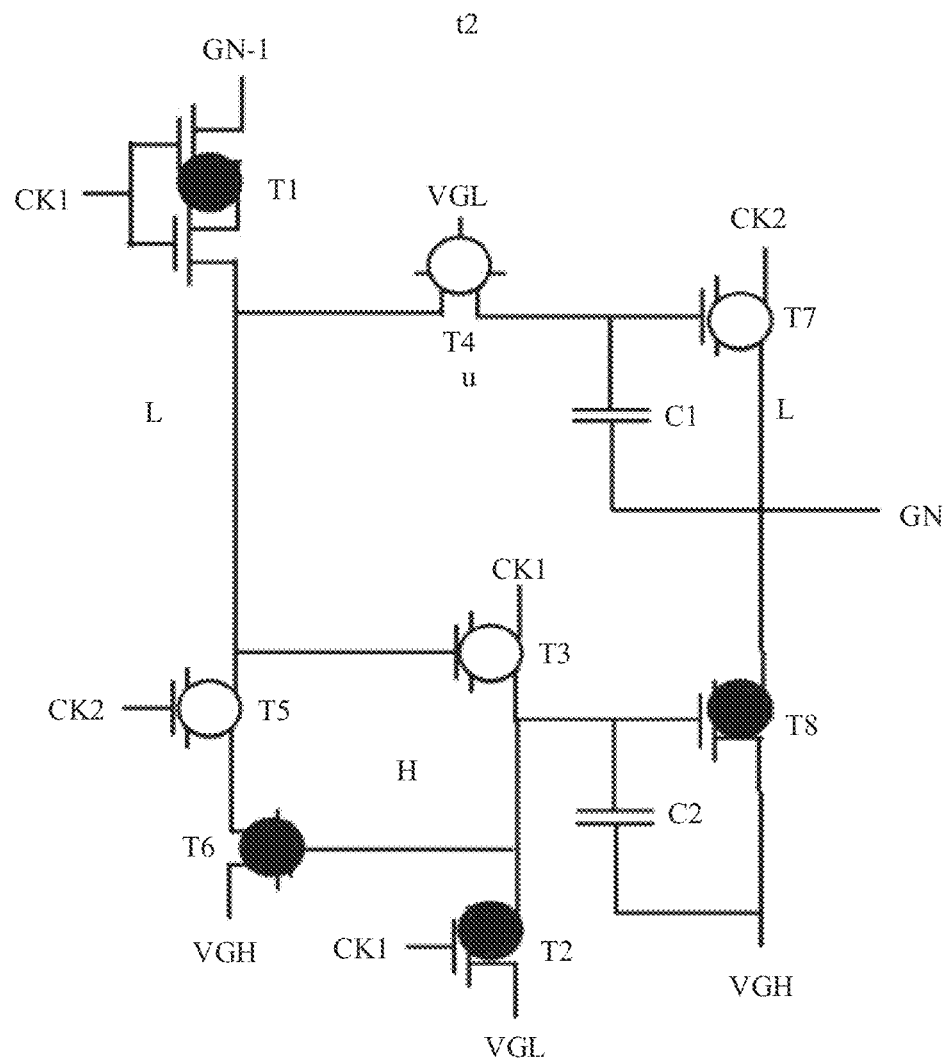
FIG. 5b is a schematic diagram of another circuit connection of the circuit shown in FIG. 3.

Similarly, FIG. 5b is a schematic diagram of another circuit connection of the circuit in FIG. 3. In an example, FIG. 5b is a schematic diagram of a circuit connection of the circuit in FIG. 3 at the moment t2. Similar to that in FIG. 5a, in FIG. 5b, a white circle indicates that a circuit in which a switching group or a switching transistor is located is in a connected state, and a black circle indicates that a circuit in which a switching transistor is located is in a disconnected state.

Figure 6:
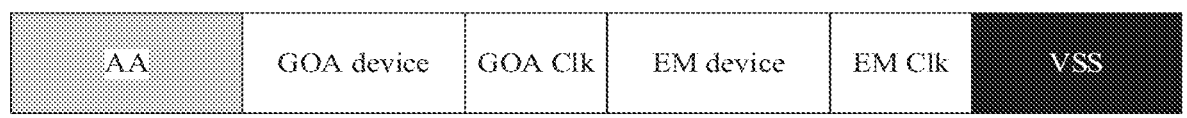
FIG. 6 is a schematic diagram of an edge connection of an OLED display module according to an embodiment of this application.

Referring to FIG. 2 again, in an example, a region 3, a region 5, a region 4, and a region 6 may be further disposed in the part b of the substrate. A GOA Clk may be arranged in the region 3, an EM device may be arranged in the region 5, an EM Clk may be arranged in the region 4, and a VSS may be arranged in the region 6. A region 7 may he further disposed on an upper surface of the part b of the substrate. A VSS the same as that in the region 6 may be arranged in the region 7. It may be understood that the VSS arranged in the region 7 may; be electrically connected to the VSS arranged in the region 6. A region 5 may be further disposed above the part a of the substrate and the region 7. In an example, an ELVSS may be arranged in the region 8. A connection relationship between the regions of the OLED display module is shown in a schematic diagram of an edge connection of the OLED display module shown in FIG. 6.

In an example, the GOA Clk may include the CK1, the CK2, and the STV in FIG. 3 to FIG. 5b.

However, both the VSS and the EM Clk are made of metal materials. If the VSS in the region 7 extends to a position above the region 4, it is likely to generate parasitic capacitance in a high-frequency case because a high-frequency signal is transmitted on the EM Clk. Consequently, the signal transmitted on the Clk is severely affected. Therefore, based on the edge layout in FIG. 6, left and right edge regions of the OLED display module are always limited by this and cannot be reduced. In addition, the VSS is also limited by this, and therefore the OLED display module is non-uniformly displayed.

Figure 7:
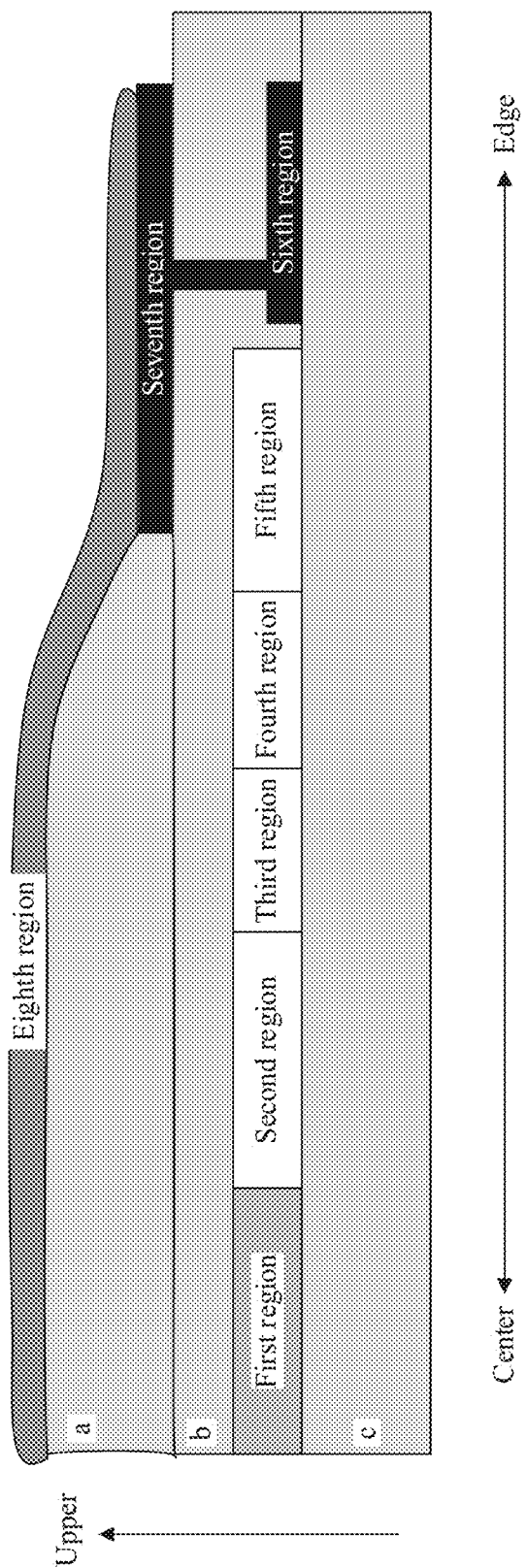
FIG. 7 is a schematic diagram of a front cross-section of another OLED display module according to an embodiment of this application.

Therefore, this application provides an OLED display module. Specifically, the OLED display module may be shown in FIG. 7. FIG. 7 is a schematic diagram of a front cross-section of another OLED display module according to an embodiment of this application.

In an example, the OLED display module may include a first region located in a part b of a substrate, where the first region is used to arrange a control element, and a plurality of other regions that are located in the part b of the substrate, that are sequentially arranged, and that are adjacent to the first region. The plurality of other regions are sequentially disposed in ascending order of distances from the first region, and the plurality of other regions may sequentially include: a second region, used to arrange a first circuit element; a third region, used to arrange a first circuit clock signal line; a fourth region, used to arrange a second circuit clock signal line; a fifth region, used to arrange a second circuit element; and a sixth region, used to arrange a first low-potential port. In an example, the OLED display module may further include a seventh region located on an upper surface of the part b of the substrate. The seventh region covers the sixth region and partially covers the fifth region, and is used to arrange a second low-potential port. It may be learned from FIG. 7 that coverage in this application does not mean that positions of two regions completely overlap, but means that there appears to be a relationship of coverage between relative positions of the two regions located at different layers. The first low-potential port in the sixth region is electrically connected to the second low-potential port in the seventh region. In an example, the OLED display module may further include an eighth region located on an upper surface of a part a of the substrate and an upper surface of the seventh region. The eighth region completely covers the seventh region and the upper surface of the part a of the substrate, and is used to arrange a third low-potential port.

In an example, the arranged control element may be the AA shown in FIG. 2. In a possible implementation, the first circuit element may be a GOA device, the first circuit clock signal line may be a GOA Clk, the second circuit element may be an EM device, and the second circuit clock signal line may be an EM Clk. In another possible implementation, the first circuit element may be an EM device, the first circuit clock signal line may be an EM Clk, the second circuit element may be a GOA device, and the second circuit clock signal line may be a GOA Clk.

In an example, both the first low-potential port and the second low-potential port may be VSSs, and VSSs in different regions are electrically connected. In another example, the third low-potential port may be an ELVSS.

In a possible implementation, that the seventh region partially covers the fifth region may include: covering a part of the fifth region, or completely covering the fifth region. It may be understood that it needs to be ensured that coverage of the VSS is not located above the Clk, and therefore the VSS arranged in the seventh region may extend to any position above the fifth region.

In an example, a partial coverage distance is from 50 microns to 100 microns.

In another example, a spacing between the first circuit clock signal line and the second circuit clock signal line is from 5 microns to 15 microns. Specifically, the spacing may be 10 microns.

It may be learned that in comparison with the OLED display module shown in FIG. 2, in FIG. 7, a position of the clock signal line on an outermost side and a position of the circuit element are interchanged. Therefore, the VSS made of metal may extend to a position above the device. This increases an available line width of the VSS. The VSS extends to a central region of the OLED display module, and therefore a bonding area between the VSS and the ELVSS increases. Impedance of the VSS is less than that of the ELVSS, and therefore impedance of a part of the ELVSS that is bonded to the VSS decreases. Therefore, overall stability of the ELVSS is improved.

Figure 8:
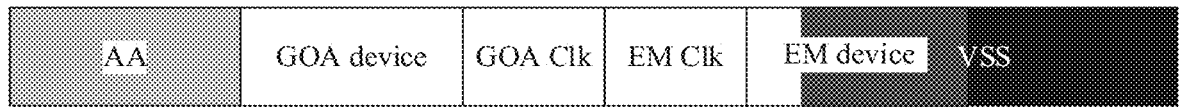
FIG. 8 is a schematic diagram of an edge connection of another OLED display module according to an embodiment of this application.

FIG. 8 is a schematic diagram of an edge connection of another OLED display module according to an embodiment of this application.

A connection relationship between the regions of the OLED display module in FIG. 7 is shown in FIG. 8. It may be learned that by interchanging positions of the EM device and the EM Clk, the VSS may extend to a center of the OLED display module, It may be understood that FIG. 8 is merely a schematic diagram of a possible position of a region. Certainly, the GOA device and the EM device may be interchanged, and correspondingly, positions of the GOA Clk and the EM Clk also need to be interchanged.

It may be learned that in the OLED display module shown in FIG. 7 and FIG. 8, the positions of the device and the Clk are interchanged, and therefore the VSS may extend to the center. If another condition remains unchanged, the line width of the VSS is increased in the case of a same panel, thereby improving display uniformity.

The VSS may extend to the center. Therefore, if same display uniformity is ensured, a frame of the OLED display screen module may be correspondingly narrowed, to implement a narrower frame.

Figure 9:
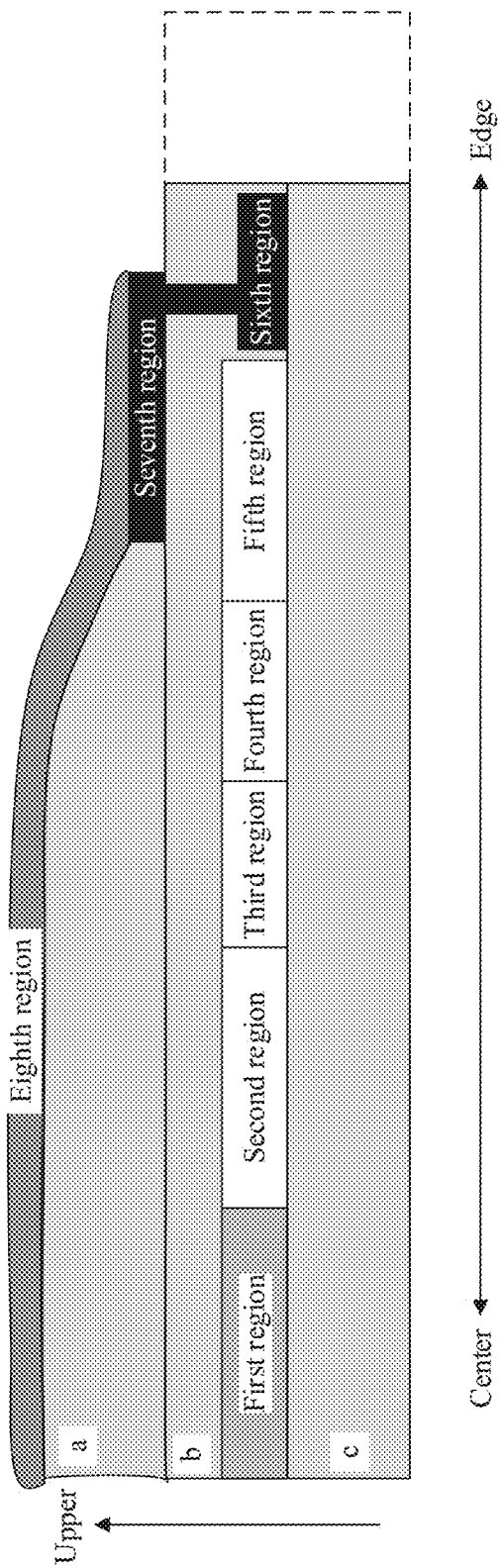
FIG. 9 is a schematic diagram of a front cross-section of still another OLED display module according to an embodiment of this application.

FIG. 9 is a schematic diagram of a front cross-section of still another OLED display module according to an embodiment of this application.

It may be learned from FIG. 9 that when an original width of the VSS in the seventh region remains unchanged, an outermost edge may be correspondingly cropped because the VSS extends to the center, so that the OLED display module has a narrower frame.

A region framed by a dashed line in FIG. 9 is a region that is cut off Clearly, in a structure shown in FIG. 9, the OLED display module has a narrower frame while the original width of the VSS is maintained. A connection relationship between the regions is shown in a schematic diagram of an edge connection of still another OLED display module shown in FIG. 10. In comparison with the schematic diagram of the connection shown in FIG. 8, clearly, in the OLED display module in FIG. 9 and FIG. 10, because of space saved by overlapping the VSS and the EM device, a panel is effectively reduced, a distance of the frame is shortened, and a narrower frame is implemented.

Figure 10:
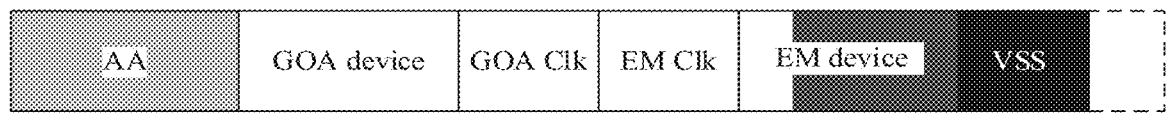
FIG. 10 is a schematic diagram of an edge connection of still another OLED display module according to an embodiment of this application.

In an example, in the OLEO display module shown in FIG. 9 and FIG. 10, the panel may be effectively reduced by 10%.

In an example, the GOA device and the EM device may include one or more PMOSs, NMOSs, or CMOSs. Certainly, in another example, the GOA device and the EM device may include low temperature poly-silicon (low temperature poly-silicon, LIPS).

In another example, the GOA Clk and the EM Clk may be made of metal such as titanium-aluminum, titanium, or copper. Certainly, it may be understood by a person in the art that other equivalent metal or another material may be used. This is not limited herein in this application.

Figure 11:
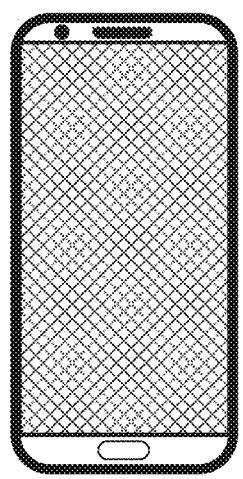
FIG. 11 is a schematic diagram of a terminal device according to an embodiment of this application.

FIG. 11 is a schematic diagram of a terminal device according to an embodiment of this application.

This application further provides a terminal device. The terminal device shown in FIG. 11 includes the OLED display module in FIG. 1 to FIG. 10, namely, a gray grid region in FIG. 11. Certainly, it should be further noted by a person in the art that the terminal device may further include other devices such as a processor and a memory, and a device may be randomly added or removed based on an actual situation, to drive the OLED display module to perform corresponding display.

In an example, the processor may be a central processing unit (central processing unit, CPU).

In another example, the memory may include a volatile memory (volatile memory), for example, a random access memory (random access memory, RAM). Alternatively, the memory may include a non-volatile memory (English: non-volatile memory), for example, a read-only memory (read-only memory, ROM), a flash memory, a hard disk drive (hard disk drive, HDD), or a solid state drive (solid state drive, SSD). Alternatively, the memory may include a combination the foregoing types of memories.

In an example, the processor may be coupled to the memory, and read and execute instructions in the memory. The processor executes the instructions during running, so that the processor may be configured to drive the OLED display module in FIG. 1 to FIG. 10.

A person of ordinary skill in the art may be aware that, in combination with the examples described in embodiments disclosed in this specification, units and algorithm steps can be implemented by electronic hardware, computer software, or a combination thereof To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

Persons of ordinary skill in the art may understand that all or a part of the steps in each of the foregoing method of embodiments may be implemented by a program instructing a processor. The foregoing program may be stored in a computer-readable storage medium. The storage medium may be a non-transitory (English: non-transitory) medium, for example may be a random-access memory, read-only memory, a flash memory, a hard disk, a solid state drive, a magnetic tape (English: magnetic tape), a floppy disk (English: floppy disk), an optical disc (English: optical disc), or any combination thereof.

The foregoing descriptions are merely example specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An organic light-emitting diode (OLED) display system comprising:
    a control element;
    a substrate comprising an upper surface;
    a first circuit element;
    a first circuit clock signal line;
    a second circuit clock signal line;
    a second circuit element;
    a first region located in the substrate and comprising two sides, wherein the control element is disposed in the first region;
    a plurality of other regions located on the two sides and sequentially disposed in ascending order of distances from the first region, wherein the other regions comprise:
        a second region configured to accommodate the first circuit element;
        a third region configured to accommodate the first circuit clock signal line;
        a fourth region configured to accommodate the second circuit clock signal line;
        a fifth region configured to accommodate the second circuit element; and
        a sixth region configured to accommodate a first low-potential port;
        a seventh region located on the upper surface and configured to:
            cover the sixth region;
            partially cover the fifth region; and
            accommodate a second low-potential port that is electrically coupled to the first low-potential port; and
        an eighth region located on the upper surface and configured to:
            cover the seventh region and the upper surface; and
            accommodate a third low-potential port.

2. The OLED display system of claim 1, wherein the seventh region is further configured to cover a part of the fifth region.

3. The OLED display system of claim 1, wherein the seventh region partially covers the fifth region over a distance within a range from 50 microns to 100 microns.

4. The OLED display system of claim 1, wherein the first circuit element is a gate on array, and wherein the second circuit element is a control emission circuit.

5. The OLED display system of claim 1, wherein a spacing between the first circuit clock signal line and the second circuit clock signal line is within a range from 5 microns to 15 microns.

6. The OLED display system of claim 1, wherein the seventh region is further configured to completely cover the fifth region.

7. The OLED display system of claim 1, wherein the first circuit element is a control emission circuit, and wherein the second circuit element is a gate on array.

8. The OLED display system of claim 1, wherein each of the first circuit clock signal line and the second circuit clock signal line comprises titanium-aluminum alloy, titanium, or copper.

9. A terminal device comprising:
    an organic light-emitting diode (OLED) display system comprising:
        a control element;
        a substrate comprising an upper surface;

a first circuit element;
a first circuit clock signal line;
a second circuit clock signal line;
a second circuit element;
a first region located in the substrate and comprising two sides, wherein the control element is disposed in the first region;
a plurality of other regions located on the two sides and sequentially disposed in ascending order of distances from the first region, wherein the other regions comprise:
  a second region configured to accommodate the first circuit element;
  a third region configured to accommodate the first circuit clock signal line;
  a fourth region configured to accommodate the second circuit clock signal line;
  a fifth region configured to accommodate the second circuit element; and
  a sixth region configured to accommodate a first low-potential port;
a seventh region located on the upper surface and configured to:
  cover the sixth region;
  partially cover the fifth region; and
  accommodate a second low-potential port electrically coupled to the first low-potential port; and
an eighth region located on the upper surface and configured to:
  cover the seventh region and the upper surface; and
  accommodate a third low-potential port.

10. The terminal device of claim 9, wherein the seventh region is further configured to cover a part of the fifth region.

11. The terminal device of claim 9, wherein the seventh region is further configured to completely cover the fifth region.

12. The terminal device of claim 9, wherein the seventh region partially covers the fifth region over a partial coverage distance within a range from 50 microns to 100 microns.

13. The terminal device of claim 9, wherein the first circuit element is a gate on array, and wherein the second circuit element is a control emission circuit.

14. The terminal device of claim 13, wherein each of the first circuit element and the second circuit element comprises one or more P-channel metal-oxide-semiconductors (PMOSs), N-channel metal-oxide-semiconductors (NMOSs), or complementary metal-oxide-semiconductors (CMOSs).

15. The terminal device of claim 13, wherein each of the first circuit element and the second circuit element comprises low-temperature poly-silicon (LTPS).

16. The terminal device of claim 9, wherein the first circuit element is a control emission circuit, and wherein the second circuit element is a gate on array.

17. The terminal device of claim 16, wherein each of the first circuit element and the second circuit element comprises one or more P-channel metal-oxide-semiconductors (PMOSs), N-channel metal-oxide-semiconductors (NMOSs), or complementary metal-oxide-semiconductors (CMOSs).

18. The terminal device of claim 16, wherein each of the first circuit element and the second circuit element comprises low-temperature poly-silicon (LTPS).

19. The terminal device of claim 9, wherein a spacing between the first circuit clock signal line and the second circuit clock signal line is within a range from 5 microns to 15 microns.

20. The terminal device of claim 9, wherein each of the first circuit clock signal line and the second circuit clock signal line comprises titanium-aluminum alloy, titanium, or copper.

* * * * *